US009864014B2

(12) United States Patent
Firehammer et al.

(10) Patent No.: US 9,864,014 B2
(45) Date of Patent: Jan. 9, 2018

(54) SYSTEM AND METHOD FOR ASSESSING VOLTAGE THRESHOLD DETECTING CIRCUITRY WITHIN A BATTERY PACK

(71) Applicant: A123 Systems, LLC, Waltham, MA (US)

(72) Inventors: Paul W. Firehammer, Saline, MI (US); John H. Floros, Novi, MI (US)

(73) Assignee: A123 Systems, LLC, Waltham, MA (US)

( * ) Notice: Subject to any disclaimer, the term of this patent is extended or adjusted under 35 U.S.C. 154(b) by 131 days.

(21) Appl. No.: 14/853,886

(22) Filed: Sep. 14, 2015

(65) Prior Publication Data

US 2016/0003916 A1 Jan. 7, 2016

Related U.S. Application Data

(63) Continuation of application No. 13/578,530, filed as application No. PCT/US2011/023680 on Feb. 4, 2011, now Pat. No. 9,157,967.

(60) Provisional application No. 61/303,389, filed on Feb. 11, 2010.

(51) Int. Cl.

| | |
|---|---|
| ***G01R 31/36*** | (2006.01) |
| ***H02J 7/00*** | (2006.01) |
| ***G01R 35/00*** | (2006.01) |

(52) U.S. Cl.
CPC ....... *G01R 31/3658* (2013.01); *G01R 31/362* (2013.01); *G01R 31/3675* (2013.01); *G01R 35/00* (2013.01)

(58) Field of Classification Search
CPC .................................................. G01R 31/3658
USPC .................. 324/434, 433; 320/116, 120, 121
See application file for complete search history.

(56) References Cited

U.S. PATENT DOCUMENTS 4,785,229 A 11/1988 Edwards
7,081,737 B2 * 7/2006 Liu .................... H01M 10/441 320/130
8,076,959 B2 12/2011 Tang et al.

OTHER PUBLICATIONS

ISA Korea, International Search Report of PCT/US2011/023680, dated Sep. 23, 2011, WIPO, 8 pages.

* cited by examiner

*Primary Examiner* — M'Baye Diao
(74) *Attorney, Agent, or Firm* — McCoy Russell LLP

(57) ABSTRACT

Systems and methods for assessing voltage threshold detection circuitry of individual battery cells within a battery pack supplying power to a vehicle are disclosed. One example system comprises, a plurality of battery cells within a battery pack, a plurality of voltage threshold detecting circuits detecting voltage of the plurality of battery cells, a voltage of a first battery cell of the plurality of battery cells coupled to a first voltage threshold detecting circuit of the plurality of voltage threshold detecting circuits, and a network that selectively couples a second battery cell to the first voltage detecting circuit while the first battery cell is coupled to the first voltage detecting circuit.

13 Claims, 5 Drawing Sheets

500
504c
504p
508c
510c
506g
504q
504l
504m
506e
3
2
1
VOLTAGE
DETECTOR
502
510
510b
504b
504k
504n
508b
506d
506f
504j
504o
504a
510a
508a
506c
516
506b
514
506a
512
504h
504f
504d

PRIOR ART

SYSTEM AND METHOD FOR ASSESSING VOLTAGE THRESHOLD DETECTING CIRCUITRY WITHIN A BATTERY PACK

CROSS REFERENCE TO RELATED APPLICATIONS

This application is a continuation of U.S. application Ser. No. 13/578,530, entitled "System and Method for Assessing Voltage Threshold Detecting Circuitry Within A Battery Pack," filed Aug. 20, 2012, which claims priority to International Patent Application Serial No. PCT/US2011/023680, entitled "System and Method for Assessing Voltage Threshold Detecting Circuitry Within A Battery Pack," filed Feb. 4, 2011, which claims priority to U.S. Provisional Patent Application Ser. No. 61/303,389, entitled "System and Method for Assessing Voltage Threshold Detecting Circuitry Within A Battery Pack," filed Feb. 11, 2010, the entire contents of each of which are hereby incorporated by reference in their entirety for all purposes.

TECHNICAL FIELD

The present description relates to assessing operation of individual battery cell voltage threshold detecting circuitry within a battery pack supplying power to a vehicle.

BACKGROUND AND SUMMARY

Lithium-ion batteries are being quickly accepted as reliable high density power storage devices, and motor vehicles, for example, may be powered at least in part by such a power storage device. In order to meet an amount of power required to run a motor vehicle, a plurality of lithium-ion batteries may be assembled into a battery pack. As such, the power storage device (e.g., battery pack) may be comprised of more than one battery cell and each battery cell may have different charging characteristics. Because battery cells may charge and discharge differently, it may be desirable to monitor individual battery cells of a battery pack. By monitoring individual battery cells, it may be possible to reduce battery cell degradation. For example, if a battery cell charge is determined to be greater than a desired level, the battery cell charge may be reduced by coupling the battery cell to a load resistor. Thus, the possibility of battery pack degradation may be reduced by monitoring battery cell charge.

However, battery cell monitoring may require circuitry, and it may be desirable to periodically assess whether or not the monitor circuitry is operating as desired. One technique for assessing whether or not battery cell monitoring circuits are operating as desired includes lowering a voltage detection threshold. As an example, the threshold voltage of voltage detection circuit may be temporarily lowered, thereby causing a voltage detector circuit to signal that the threshold voltage has been exceeded by a battery cell. Such an assessment, however, may not accurately indicate that the voltage detector is not degraded. For example, because the threshold voltage is lowered during the assessment, it is unknown if the voltage detector will indicate an exceeded threshold at the desired level (e.g., if the voltage detector threshold is lowered to 0.25 volts it is unknown whether or not the voltage detector will operate at a voltage of 1.25 volts).

Thus, the inventors herein have developed a system for assessing voltage detection circuitry within a battery pack. In particular, the inventors have developed a system for assessing voltage threshold detection circuitry of individual battery cells within a battery pack supplying power to a vehicle, comprising: a plurality of battery cells within a battery pack, a plurality of voltage threshold detecting circuits detecting voltage of the plurality of battery cells, a voltage of a first battery cell of the plurality of battery cells coupled to a first voltage threshold detecting circuit of the plurality of voltage threshold detecting circuits, and a network that selectively couples a second battery cell to said first voltage detecting circuit while the first battery cell is coupled to the first voltage detecting circuit.

By selectively coupling the second battery cell to the first voltage detecting circuit while the first battery cell is coupled to the first voltage detecting circuit, the total voltage detected by the voltage threshold detecting circuit may be increased. Further, the system may include a plurality of networks to increase the voltage detected by the plurality of voltage detecting circuits in a similar manner. As such, the desired threshold voltage may be exceeded without decreasing the threshold that triggers voltage detection circuitry. As a result, operation of voltage detection circuitry can be assessed at a voltage level that is more representative of a voltage level that is greater than a desired threshold voltage level. Therefore, the present system may indicate degradation of voltage threshold detecting circuitry more accurately.

The present description may provide several advantages. In particular, the approach may provide an improved estimate of degradation of voltage threshold detecting circuitry for individual battery cells within a battery pack. In addition, the approach may provide improved control over the state of charge of a battery pack by increasing the possibility that battery cells will be drained of a portion of their charge when the battery voltage exceeds a threshold. Further, the approach may be more reliable than other methods.

The above advantages and other advantages, and features of the present description will be readily apparent from the following Detailed Description when taken alone or in connection with the accompanying drawings.

It should be understood that the summary above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

DETAILED DESCRIPTION

Figure 1:
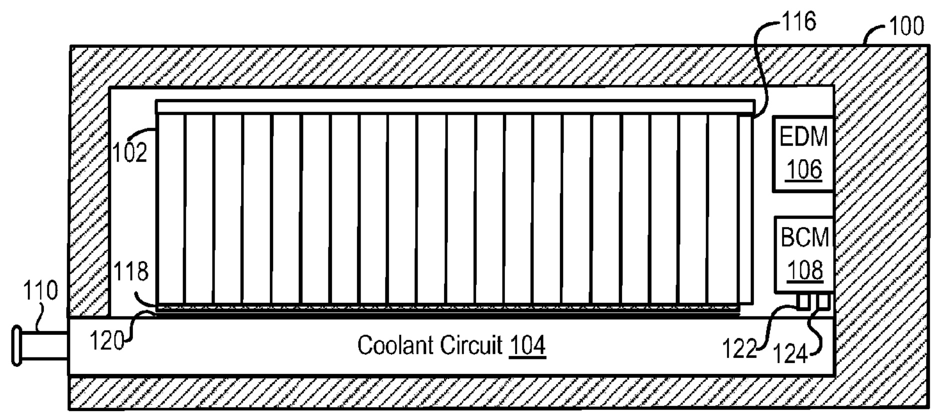
FIG. 1 shows a schematic view of a battery control system.
Figure 2:
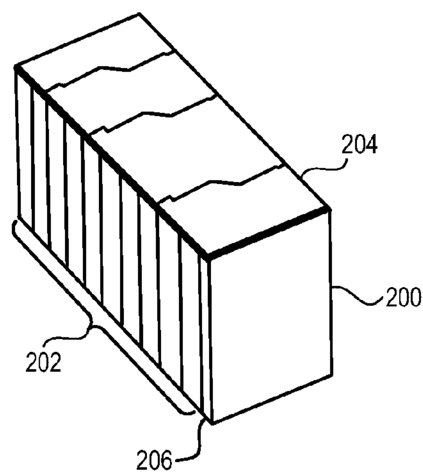
FIG. 2 shows a schematic view of an exemplary assembly of a battery cell stack.
Figure 3:
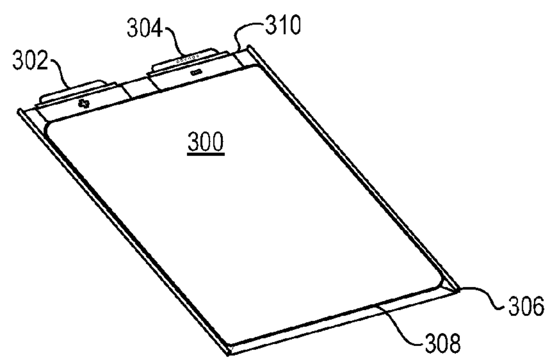
FIG. 3 shows a schematic view of an exemplary battery cell.
Figure 4:
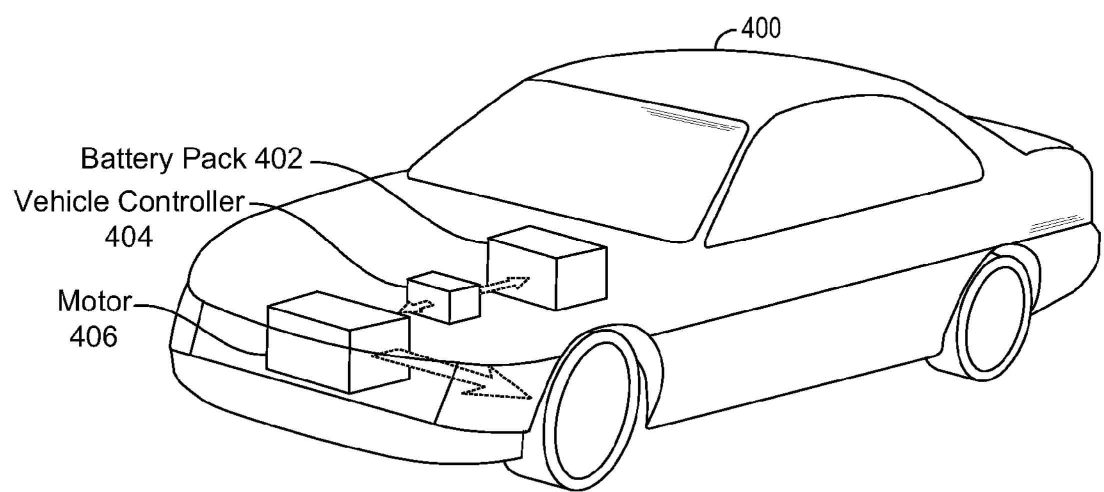
FIG. 4 shows a schematic view of a battery control system in a motor vehicle.

The present description is related to assessing voltage threshold detection circuitry of individual battery cells within a battery pack supplying power to a vehicle. In one embodiment, the battery pack may be designed to include an enclosure and structure as is illustrated in FIG. 1. The battery pack may be comprised of one or more battery cell stacks, an example of which is illustrated in FIG. 2. The battery cell stacks are comprised of a plurality of battery cells, an example of which is illustrated in FIG. 3. A non-limiting application of a battery pack is illustrated in FIG. 4.

Figure 5:
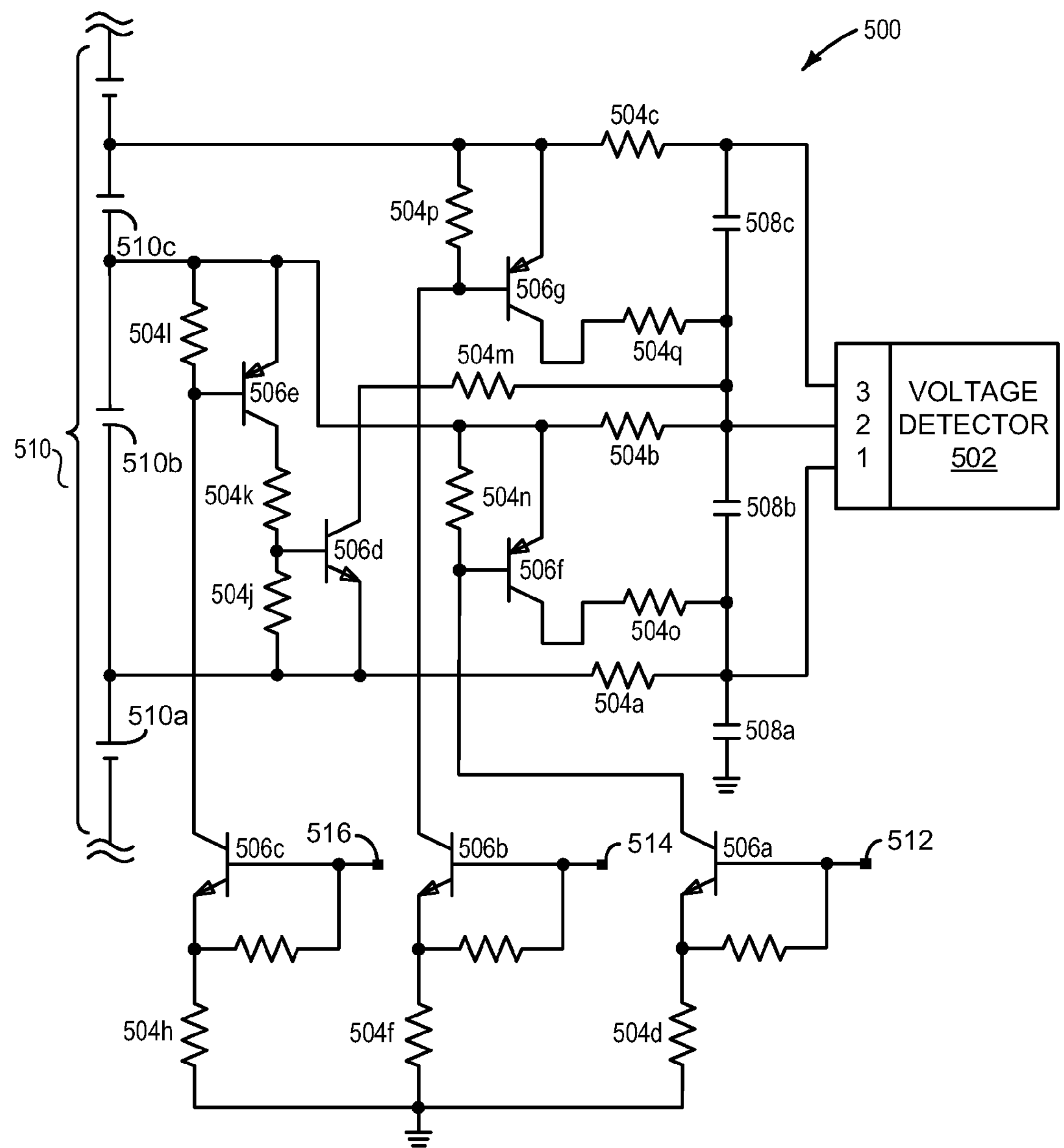
FIG. 5 shows a schematic view of a system for assessing voltage threshold detection circuitry.

Operation of voltage detection circuitry may be assessed by a self-test function while a battery pack is in service. In particular, a system such as depicted in FIG. 5 may be activated to assess operation of voltage detection circuits at a voltage level that is representative of a battery cell voltage greater than a threshold voltage. In such a system, a network of switches and resistors, for example, couples a second battery cell to a first voltage detecting circuit while a first battery cell is coupled to the first voltage detecting circuit, thereby increasing the voltage detected by the first voltage detector. Other battery cells in the plurality of battery cells may be coupled to voltage detectors in a likewise manner in order to increase a voltage detected by other voltage detecting circuits. In this way, the voltage detection circuitry may be assessed and degradation of the voltage threshold detection circuitry may be more accurately indicated.

Referring now to FIG. 1, an example battery pack 100 is illustrated. Battery pack 100 includes battery cell stack 102, coolant circuit 104, electrical distribution module (EDM) 106, and BCM 108. In the depicted embodiment, coolant enters the coolant circuit at coolant connector 110. Further, coolant circuit 104 is in thermal communication with battery cell stack 102 via conductive grease 118 and a cold plate 120. When heat is generated by cell stack 102, coolant circuit 104 transfers the heat to a location outside of battery pack 100. In one embodiment, coolant circuit 104 may be in communication with a vehicle radiator when the battery pack is coupled in a vehicle.

Voltage of battery cells in battery cell stack 102 is monitored and balanced by monitor and balance board (MBB) 116, which may include a plurality of current, voltage, and other sensors. The EDM 106 controls the distribution of power from the battery pack to the battery load. In particular, EDM 106 contains contacts for coupling high voltage battery power to an external battery load such as an inverter. The BCM 108 controls ancillary modules within the battery pack such as the EDM and cell MBB, for example. Further, the BCM may be comprised of a microprocessor having random access memory, read only memory, input ports, real time clock, output ports, and a computer area network (CAN) port for communicating to MBBs and other battery pack modules. Humidity sensor 122 and temperature sensor 124 provide internal environmental conditions of battery pack 100 to BCM 108.

Referring now to FIG. 2, an exemplary assembly of a battery stack 200 is shown. Battery stack 200 is comprised of a plurality of battery cells 202. In some embodiments, the battery cells may be lithium-ion battery cells, for example. In the example of FIG. 2, battery stack is comprised of ten battery cells. Although battery stack 200 is depicted as having ten battery cells, it should be understood that a battery stack may include more or less than ten cells. For example, the number of cells in a battery stack may be based on an amount of power desired from the battery stack. Within a battery cell stack, cells may be coupled in series to increase the battery cell stack voltage, or battery cells may be coupled in parallel to increase current capacity at a particular battery cell voltage. Further, a battery pack, such as battery pack 100 in FIG. 1, may be comprised of one or more battery cell stacks. As shown in FIG. 2, battery stack 200 further includes cover 206 which provides protection for battery bus bars (not shown) that route charge from the plurality of battery cells to output terminals of a battery pack. Battery stack 200 also includes one or more MBB 206. MBB 206 is shown at the front end of battery stack 200, but an additional MBB may be included at the back or opposite side of battery stack 200 depending on the battery stack configuration.

Turning now to FIG. 3, an exemplary embodiment of an individual battery cell is shown. Battery cell 300 includes cathode 302 and anode 304 for connecting to a bus (not shown). The bus routes charge from a plurality of battery plates to output terminals of a battery pack and is coupled to bus bar support 310. Battery cell 300 further includes prismatic cell 308 that contains electrolytic compounds. Prismatic cell 308 is in communication with heat sink 306. Heat sink 306 may be formed of a metal plate with the edges bent up 90 degrees on one or more sides to form a flanged edge. In the example of FIG. 3, the bottom edge, and sides, each include a flanged edge.

When a plurality of cells is put into a stack, the Prismatic cells are separated by a compliant pad (not shown). Thus, a battery cell stack is built in the order of heat sink, Prismatic cell, compliant pad, Prismatic cell, heat sink, and so on. One side of the heat sinks (e.g., flanged edges) may then contact the cold plate to improve heat transfer.

Referring now to FIG. 4, a schematic view of a non-limiting application of the present system and method is shown. In particular, battery pack 402 is installed in a vehicle 400 for the purpose of supplying energy to propel vehicle 400 by way of electric motor 406. As shown in FIG. 4, vehicle controller 404 may facilitate communication between battery pack 402 and motor 406. In one embodiment, vehicle 400 may be propelled solely by electric motor 406. In another embodiment, vehicle 400 may be a hybrid vehicle that may be propelled by an electric motor and an internal combustion engine.

Turning now to FIG. 5, a schematic diagram of a system for assessing voltage threshold detection circuitry 500 is shown. As depicted, the system includes a plurality of battery cells 510 coupled to a voltage detector 502 via a network of switches and resistors. Specifically, the system selectively couples one battery cell to another battery cell in order to increase a voltage detected by the voltage detector 502. The circuitry of FIG. 5 may be incorporated into an MBB for example.

In the example of FIG. 5, the plurality of battery cells 510 is shown in communication with a voltage detector 502 which includes voltage detection circuitry. Voltage detection circuitry 502 may monitor a battery cell for changes in voltage. In one embodiment, voltage detection circuitry 502 may be comprised of an A/D converter. In another embodiment, the voltage detection circuitry may be comprised of a comparator referenced to a threshold voltage. If the input to the voltage detection circuitry exceeds a threshold, voltage detection circuitry may change state from a low voltage output to a higher voltage output. The higher voltage output provides an indication that the particular battery cell is charged to a level greater than a desired level. In another example, a memory location of a microcontroller may change state (e.g., from a 0 to 1) when input voltage exceeds a threshold level. Three input channels of voltage detector 502 are labeled at the left hand side of voltage detector 502.

During routine battery cell voltage monitoring, the higher potential side of battery cell number one 510*a* is coupled to voltage detector channel 1 by way of resistor 504*a*. Resistor 504*a* and capacitor 508*a* form a low pass filter to reduce high frequency voltage noise that may be present across battery cell 510*a*. Likewise, the higher potential side of battery cell number two 510*b* is coupled to voltage detector channel 2 by way of resistor 504*b*, and the higher potential side of battery cell number three 510*c* is coupled to voltage detector channel 3 by way of resistor 504*c*.

Operation of voltage detection channel 1 may be verified by supplying a voltage to the base of NPN transistor 506*a* at 512. A voltage applied to the base of NPN transistor 506*a* will cause current to flow into the base of the transistor, thereby causing NPN transistor 506*a* to switch from an open (e.g., non-conducting) state to a closed (e.g., conducting) state. When NPN transistor 506*a* begins to conduct, the base of PNP transistor 506*f* is brought closer to ground by way of resistor 504*d*. PNP transistor 506*f* then starts to conduct as current flows out of the base of PNP transistor 506*f*. Since the emitter of PNP transistor 506*f* is coupled to the higher potential of battery cell 510*b*, resistor 504*o* pulls up the voltage at voltage detector channel 1 when PNP transistor 506*f* is turned on. Thus, the voltage developed at capacitor 508*a* and voltage detector channel 1 increases closer to the combined voltage of battery cell 510*a* and 510*b*. In this way, channel 1 of the voltage detector circuitry can be subjected to a higher voltage than is available solely from battery cell number one 510*a*.

When a low voltage (e.g., ground) is reapplied to the base of NPN transistor 506*a*, NPN transistor 506*a* stops conducting and the base of PNP transistor 506*f* is pulled to the higher potential side of battery cell 510*b* by resistor 504*n*. PNP transistor 506*f* therefore stops conducting and the voltage of capacitor 508*a* and voltage detector channel 1 return to that of battery cell 510*a*.

Operation of voltage detection channel 2 may be verified in a similar manner. Specifically, a voltage can be applied to the base of NPN transistor 506*b* at 514. A voltage applied to the base of NPN transistor 506*b* will cause current to flow into the base of the transistor 506*b*, thereby causing NPN transistor 506*b* to switch from an open (e.g., non-conducting) state to a closed (e.g., conducting) state. When NPN transistor 506*b* begins to conduct, the base of PNP transistor 506*g* is brought closer to ground by way of resistor 504*f*. PNP transistor 506*g* then starts to conduct as current flows out of the base of PNP transistor 506*g*. Since the emitter of PNP transistor 506*g* is coupled to the higher potential of battery cell 510*c*, resistor 504*q* pulls up the voltage at voltage detector channel 2 when PNP transistor 506*g* is turned on. Thus, the voltage developed at capacitor 508*b* and voltage detector channel 2 increases closer to the combined voltage of battery cell 510*b* and 510*c*. In this way, channel 2 of the voltage detector circuitry can be subjected to a higher voltage than is available solely from battery cell number two 510*b*.

When a low voltage is reapplied to the base of NPN transistor 506*b*, NPN transistor 506*b* stops conducting and the base of PNP transistor 506*g* is pulled to the higher potential side of battery cell 510*c* by resistor 504*p*. PNP transistor 506*g* therefore stops conducting and the voltage of capacitor 508*b* and voltage detector channel 2 return to that of battery cell 510*b*.

Operation of voltage detection channel 3 may be verified in a slightly different manner. In particular, a voltage can be applied to the base of NPN transistor 506*c* at 516. A voltage applied to the base of NPN transistor 506*c* will cause current to flow into the base of the transistor, thereby causing NPN transistor 506*c* to switch from an open (e.g., non-conducting) state to a closed (e.g., conducting) state. When NPN transistor 506*c* begins to conduct, the base of PNP transistor 506*e* is brought closer to ground by way of resistor 504*h*. PNP transistor 506*e* then starts to conduct as current flows out of the base of PNP transistor 506*e*. Since the emitter of PNP transistor 506*e* is coupled to the higher potential of battery cell 510*b*, resistor 504*k* pulls up the voltage between resistors 504*k* and 504*j* closer to the voltage of the higher potential side of battery cell 510*b*. As a result, current flows into the base of NPN transistor 506*d* causing NPN transistor 506*d* to conduct and allowing resistor 504*m* to pull the voltage at voltage detector channel 2 closer to the voltage level of battery cell 510*a*. As a result, the voltage across capacitor 508*c* and voltage detector channel 3 increases. In this way, channel 3 of the voltage detector circuitry can be subjected to a higher voltage than is available solely from battery cell number three 510*c*.

When a low voltage is reapplied to the base of NPN transistor 506*c*, NPN transistor 506*c* stops conducting and the base of PNP transistor 506*e* is pulled to the higher potential side of battery cell 510*b* by resistor 504*i*. PNP transistor 506*e* therefore stops conducting and the voltage between resistors 504*k* and 504*j* approaches the voltage of battery cell 510*a*. As a result, NPN transistor 506*d* stops conducting and the voltage at voltage detector channel 2 returns to the voltage of battery cell 510*b*. Further, the voltage across capacitor 508*c* and voltage detector channel 3 return to the voltage level of battery cell 510*c*.

In one example, a microcontroller coupled to the MBB may control the circuit of FIG. 5. Further, the MBB microcontroller may activate battery cell threshold detector assessment circuitry in response to a request by the BCM over a CAN link.

It should be noted that the circuit illustrated in FIG. 5 in merely exemplary in nature and non-limiting. Similar circuitry may be constructed with MOSFETS, other types of transistors, or other switching devices and is anticipated by the present disclosure.

Figure 6:
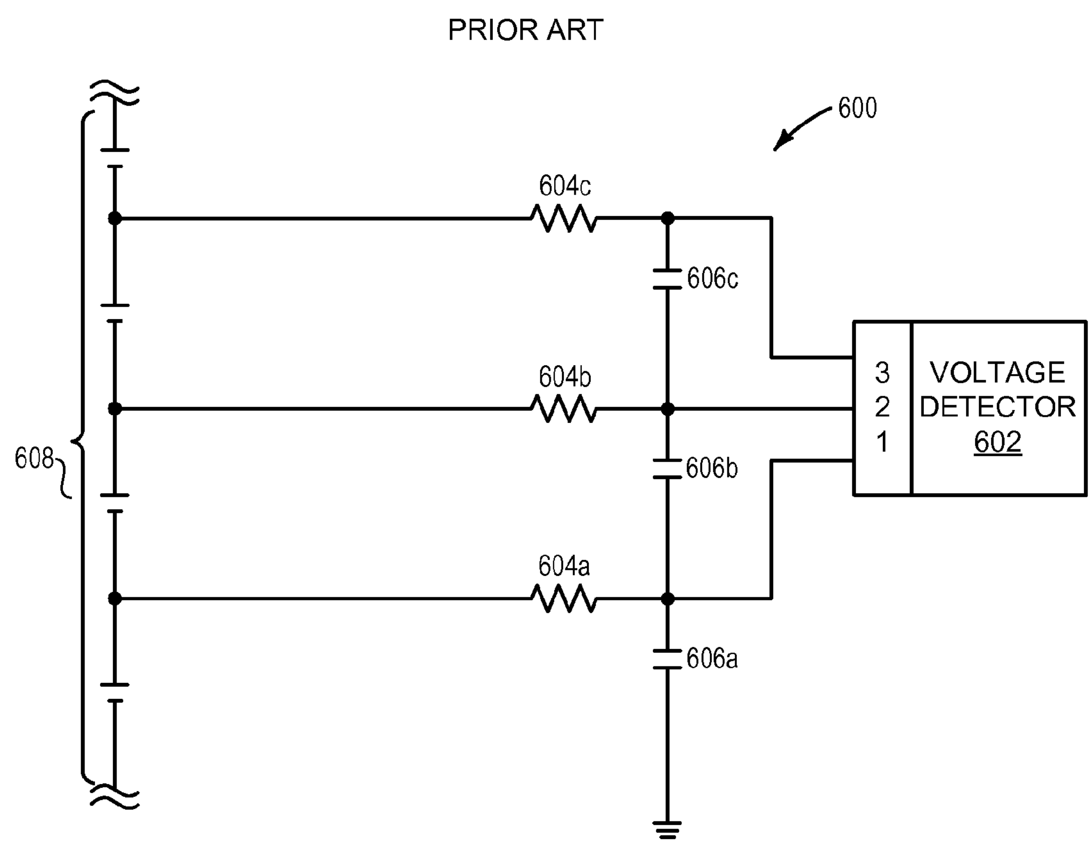
FIG. 6 shows a schematic view of a system for assessing voltage threshold detection circuitry according to prior art.

Referring now to FIG. 6, a schematic view of a system for assessing voltage threshold detection circuitry according to prior art is shown. Battery cells 608 are coupled to the input of voltage detector 602 via resistors 604*a*, 604*b*, and 604*c*. Voltage detector 602 includes channels 1-3 as indicated at the left hand side of voltage detector 602. Voltage detector channel 1 measures the voltage across capacitor 606*a* with respect to ground. Voltage detector channel 2 measures the voltage across capacitor 606*b* with respect to the voltage of capacitor 606*a*. Voltage detector channel 3 measures the voltage across capacitor 606*c* with respect to the voltage of capacitor 606*b*. Thus, this circuit restricts the range of voltage that may be applied to each channel of voltage detector 602 to the voltage level of a single battery cell. As a result, the channels of voltage detector 602 may only be exposed to a voltage greater than a threshold voltage if one of the battery cells 608 is at a voltage greater than a threshold.

Thus, the system described in FIGS. 1-6 provides for a system for assessing voltage threshold detection circuitry of individual battery cells within a battery pack supplying power to a vehicle, comprising: a plurality of battery cells within a battery pack; a plurality of voltage threshold detecting circuits detecting voltage of the plurality of battery cells, a voltage of a first battery cell of the plurality of battery cells coupled to a first voltage threshold detecting circuit of the plurality of voltage threshold detecting circuits; and a network that selectively couples a second battery cell to the first voltage detecting circuit while the first battery cell is coupled to the first voltage detecting circuit. The system includes where the second battery cell is adjacent to the first battery cell in a battery cell stack. The system also includes where the network is comprised of switches and resistors. In some examples, the system further comprises a plurality of networks to increase the voltage of the plurality of voltage threshold detecting circuits. In this way, the system may provide for a network for each battery cell. The system also includes where the plurality of battery cells is comprised of one or more battery cell stacks and where the battery cells are lithium-ion battery cells. In some examples the switches are bipolar junction transistors. In other examples, the switches are field effect transistors.

The systems of FIGS. 1-6 also provide for assessing voltage threshold detection circuitry of individual battery cells within a battery pack supplying power to a vehicle, comprising: a first and second battery cells within a battery cell stack; a first voltage threshold detecting circuit, said first battery cell coupled to said battery cell stack; a network that selectively couples a second battery cell to said first voltage detecting circuit while said first battery cell is coupled to said first voltage detecting circuit; and a microcontroller coupled to said network and said first voltage detecting circuit. In this system the plurality of battery cells may be lithium-ion battery cells. Further, the network may be comprised of switches and resistors. In at least one example, the second battery cell voltage is at a higher potential than the first battery cell.

Figure 7:
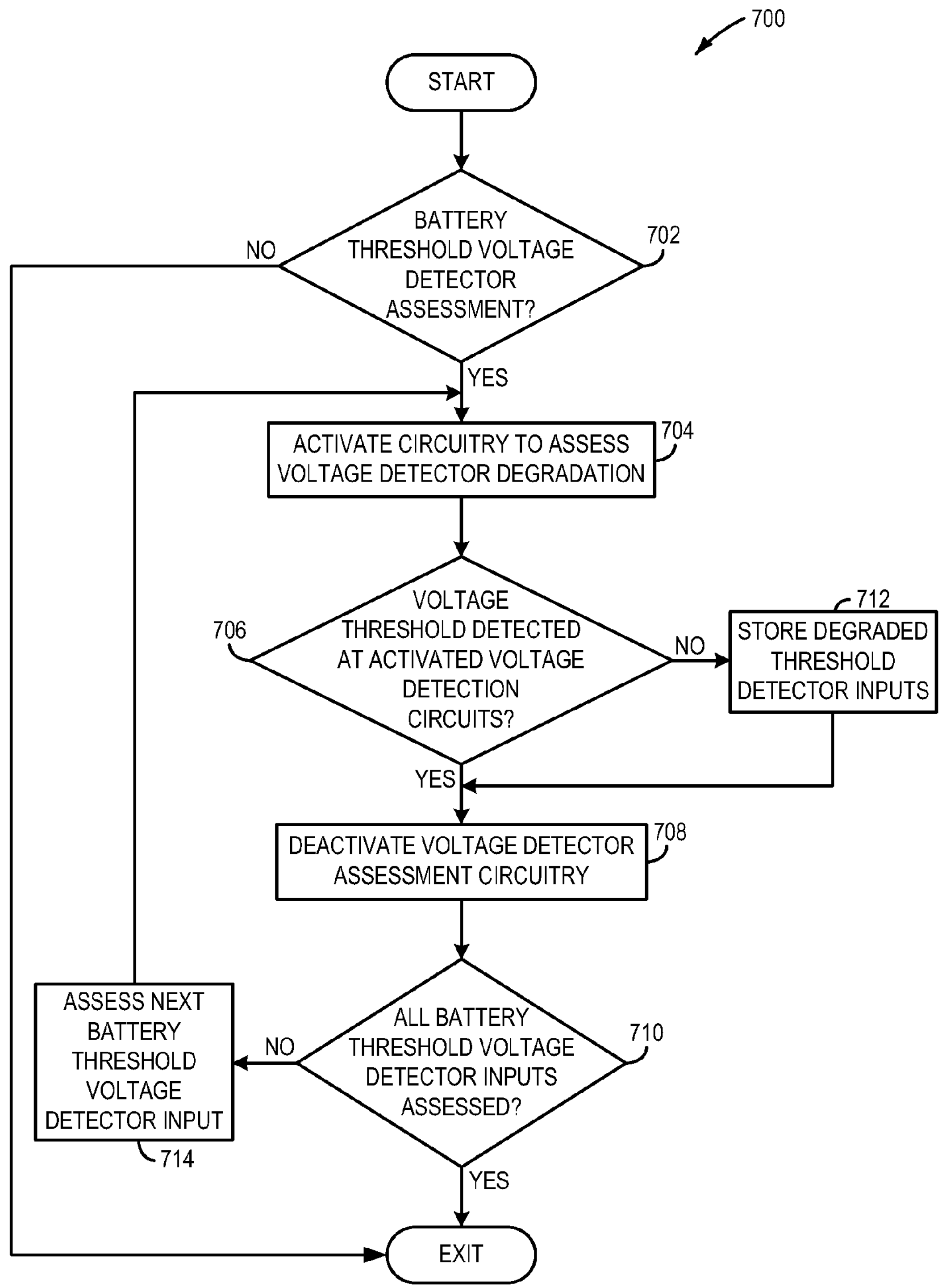
FIG. 7 shows a flow chart illustrating a method for assessing voltage threshold detection circuitry.

Turning now to FIG. 7, a flow chart illustrating a method 700 for assessing a voltage threshold detecting circuit for a battery cell of a battery pack is shown. Specifically, method 700 determines if a threshold voltage assessment may occur and the assessment is carried out accordingly.

At 702 of method 700, it is determined if a battery cell threshold detector assessment may occur. A battery cell threshold detector assessment may occur during periods when the battery pack is not connected to a load; for example, when the battery pack exits a sleep mode and before the battery pack voltage is applied to the load. A battery cell threshold detector assessment may also be requested when the battery pack is in a diagnostic mode. If it is determined that an assessment may not occur, method 700 proceeds to exit. On the other hand, if it is determined that a battery cell threshold detector assessment may occur, method 700 continues to 704 where threshold voltage detector assessment circuitry is activated to assess voltage detector degradation.

Activating the threshold voltage detector assessment circuitry may include activating one or more networks of switches and resistors, as described above with reference to FIG. 5. For example, a first battery cell may be selectively coupled to a second battery cell via the assessment circuitry in order to increase a voltage detected by the voltage detector thereby exceeding the threshold voltage.

Once the assessment circuitry is activated, method 700 of FIG. 7 proceeds to 706 where it is judged if the desired voltage threshold is detected (e.g., voltage threshold exceeded) at the activated circuits. A threshold detector that does not detect that the voltage threshold has been exceeded may be degraded and thus, the degraded threshold detector inputs are stored at 712 of method 700 and the method continues to 708. Information regarding threshold voltage detection circuits stored at 712 may be supplied to the BCM. The BCM may take mitigating actions, such reporting voltage detector degradation to a vehicle controller, for example. If the voltage threshold is detected at 706, method 700 continues to 708 where the voltage detector assessment circuitry is deactivated. Deactivating the assessment circuitry includes opening one or more switches such that a battery cell is no longer coupled to an adjacent cell at the voltage detector input, for example.

At 710 of method 700, it is judged if all battery cell threshold voltage detector inputs have been assessed. If all battery cell threshold voltage detector inputs have been assessed, method 700 proceeds to exit. On the other hand, if all battery cell threshold voltage detector inputs have not been assessed, method 700 moves to 714 where the next battery cell threshold voltage detector input is assessed. Thus, the voltage detection circuits may be sequentially evaluated. However, in one example, two battery cells at different ends of a battery cell stack may be assessed at the same time. For example, the end battery cells of a battery stack may be simultaneously assessed first and additional battery cells may be assessed two at a time moving from the battery cells at the end of a battery cell stack to the battery cells at the middle of a battery cell stack. In another example, two middle battery cells of a battery stack may be assessed first followed by pairs of battery cells moving from the center of the battery cell stack to the ends of the battery cell stack.

In this manner, threshold voltage detectors for battery cells may be assessed periodically. And, degradation of one or more of threshold voltage detectors may be indicated, providing for improved control over the state of charge of a battery pack.

Thus, the method of FIG. 7 provides for a method for assessing a voltage threshold detecting circuit for a battery cell of a battery pack supplying power to propel a vehicle, comprising: coupling a first battery cell to a voltage threshold detecting circuit; and selectively coupling a second battery cell to said voltage threshold detecting circuit, said second battery cell in a battery cell stack, said battery cell stack including said first battery cell. The method includes where the second battery cell is coupled to said voltage detecting circuit when the battery is transitioned from a sleep mode to an operating mode. The method also includes where the second battery cell is coupled to the voltage threshold detecting circuit by a network comprised of resistors and switches. In some examples, the switches are bipolar junction transistors. In other examples, the switches are field effect transistors. The method also includes where the second battery cell is coupled to the voltage threshold detecting circuit by an output of a microcontroller. The method also includes where the second battery cell is coupled to the voltage threshold detecting circuit in response to a diagnostic routine. In one example, the second battery cell is adjacent to the first battery cell in the battery cell stack.

The method of FIG. 7 also provides for assessing a voltage threshold detecting circuit for a battery cell of a battery pack supplying power to propel a vehicle, comprising: coupling a first battery cell to a first voltage threshold detecting circuit; coupling a third battery cell to a second voltage threshold detecting circuit; selectively coupling a second battery cell to the first voltage threshold detecting circuit; and selectively coupling a fourth battery cell to the second voltage threshold detecting circuit, the fourth battery coupled to the second voltage threshold detecting circuit for at least a portion of time the second battery cell is couple to the first voltage threshold detecting circuit, the second battery cell in a battery cell stack, the battery cell stack including the first battery cell, the third battery cell, and the fourth battery cell. The method also includes where the selective coupling of the second battery cell to the first voltage threshold detecting circuit is performed before a voltage of said battery pack is applied to a load external to said battery pack.

The method of FIG. 7 also provides for assessing voltage threshold detection circuitry of individual battery cells within a battery pack, comprising: supplying power to propel a vehicle from the battery pack, the battery pack including a plurality of battery cells; detecting voltage of said plurality of battery cells via a plurality of voltage threshold detecting circuits, where a voltage of a first battery cell of said plurality of battery cells is coupled to a first voltage threshold detecting circuit of said plurality of voltage threshold detecting circuits; and selectively coupling a second battery cell to said first voltage detecting circuit via a network while said first battery cell is coupled to said first voltage detecting circuit.

The subject matter of the present disclosure includes all novel and nonobvious combinations and subcombinations of the various systems and configurations, and other features, functions, and/or properties disclosed herein.

The following claims particularly point out certain combinations and subcombinations regarded as novel and nonobvious. These claims may refer to "an" element or "a first" element or the equivalent thereof. Such claims should be understood to include incorporation of one or more such elements, neither requiring nor excluding two or more such elements. Other combinations and subcombinations of the disclosed features, functions, elements, and/or properties may be claimed through amendment of the present claims or through presentation of new claims in this or a related application. Such claims, whether broader, narrower, equal, or different in scope to the original claims, also are regarded as included within the subject matter of the present disclosure.

The invention claimed is:

1. A system for assessing voltage threshold detection circuitry of individual battery cells within a battery pack supplying power to a vehicle, comprising:

- a first battery cell and a second battery cell within a battery pack;
- a first voltage threshold detecting circuit coupled to a higher potential side of said first battery cell and a second voltage threshold detecting circuit coupled to a higher potential side of said second battery cell; and
- a first network that increases a voltage applied to said first voltage threshold detecting circuit and a second network that increases a voltage applied to said second voltage threshold detecting circuit, the first network selectively coupling said higher potential side of said second battery cell to said first voltage threshold detecting circuit while said higher potential side of said first battery cell is coupled to said first voltage threshold detecting circuit.

2. The system of claim 1, wherein said second battery cell is adjacent to said first battery cell in a battery cell stack, and wherein said second network selectively couples a higher potential side of a third battery cell to said second voltage threshold detecting circuit while said higher potential side of said second battery cell is coupled to said second voltage threshold detecting circuit.

3. The system of claim 1, wherein said first and second networks are comprised of switches and resistors, and where said higher potential side of said second battery cell is coupled to said first voltage threshold detecting circuit via a resistor and a first transistor, the first transistor coupled to a second transistor that selectively activates the first transistor.

4. The system of claim 1, further comprising a plurality of networks to increase voltages applied to a plurality of voltage threshold detecting circuits.

5. The system of claim 1, wherein said first battery cell and said second battery cell are included in one or more battery cell stacks.

6. The system of claim 1, wherein said first battery cell and said second battery cell are lithium-ion battery cells.

7. The system of claim 3, wherein said switches are bipolar junction transistors.

8. The system of claim 3, wherein said switches are field effect transistors.

9. A system for assessing voltage threshold detection circuitry of individual battery cells within a battery pack supplying power to a vehicle, comprising:

- a first and second battery cell within a battery cell stack;
- a first voltage threshold detecting circuit coupled to a higher potential side of said first battery cell via a first resistor;
- a first network that selectively couples a higher potential side of said second battery cell to said first voltage threshold detecting circuit to increase a voltage applied to said first voltage threshold detecting circuit while said higher potential side of said first battery cell is coupled to said first voltage threshold detecting circuit via said first resistor while said higher potential side of said second battery cell is coupled to a second voltage threshold detecting circuit via a second resistor; and
- a microcontroller coupled to said first network and said first voltage threshold detecting circuit.

10. The system of claim 9, wherein said first and second battery cells are lithium-ion battery cells, and a second network that increases a voltage applied to said second voltage threshold detecting circuit, said second network selectively coupling a higher potential side of a third battery cell to said second voltage threshold detecting circuit while said higher potential side of said second battery cell is coupled to said second voltage threshold detecting circuit.

11. The system of claim 9, wherein said first network is comprised of switches and resistors, and where said higher potential side of said second battery cell is coupled to said first voltage threshold detecting circuit via a second resistor and a first transistor, the first transistor coupled to a second transistor that selectively activates the first transistor.

12. The system of claim 9, wherein a second battery cell voltage is at a higher potential than a first battery cell voltage.

13. A system for assessing voltage threshold detection circuitry of individual battery cells within a battery pack supplying power to a vehicle, comprising:

- a first and second battery cell within a battery cell stack;
- a first voltage threshold detecting circuit coupled to a higher potential side of said first battery cell;
- a network that selectively couples a higher potential side of said second battery cell to said first voltage threshold detecting circuit to increase a voltage applied to said first voltage threshold detecting circuit while said higher potential side of said first battery cell is coupled to said first voltage threshold detecting circuit and while said higher potential side of said second battery cell is coupled to a second voltage threshold detecting circuit; and
- a microcontroller coupled to said network and said first voltage threshold detecting circuit, said microcontroller including executable instructions stored in non-transitory memory to couple said higher potential side of said second battery cell to said first voltage threshold detecting circuit to increase said voltage applied to said first voltage threshold detecting circuit in response to a voltage threshold detecting circuit diagnostic assessment.

* * * * *